United States Patent
Huang et al.

(10) Patent No.: US 10,367,450 B2
(45) Date of Patent: Jul. 30, 2019

(54) OSCILLATOR SCHEME CAPABLE OF REDUCING FAR-OUT PHASE NOISE AND CLOSED-IN PHASE NOISE

(71) Applicant: MEDIATEK INC., Hsin-Chu (TW)

(72) Inventors: Hao-Wei Huang, Taoyuan (TW); Yen-Tso Chen, Hsinchu (TW); Kun-Yin Wang, Tainan (TW)

(73) Assignee: MediaTek Inc., Hsin-Chu (TW)

( * ) Notice: Subject to any disclaimer, the term of this patent is extended or adjusted under 35 U.S.C. 154(b) by 111 days.

(21) Appl. No.: 15/345,483

(22) Filed: Nov. 7, 2016

(65) Prior Publication Data

US 2017/0170784 A1    Jun. 15, 2017

Related U.S. Application Data

(60) Provisional application No. 62/267,296, filed on Dec. 15, 2015.

(51) Int. Cl.
*H03B 1/04*  (2006.01)
*H03B 5/00*  (2006.01)
(Continued)

(52) U.S. Cl.
CPC ............. *H03B 1/04* (2013.01); *H03B 5/00* (2013.01); *H03B 5/362* (2013.01); *H03B 5/366* (2013.01);
(Continued)

(58) Field of Classification Search
CPC .... H03K 21/38; H03K 3/02337; H03B 5/364; H03B 5/362; H03B 5/366; H03B 2200/009; H03B 2200/0062; H03L 5/00
(Continued)

(56) References Cited

U.S. PATENT DOCUMENTS 3,829,795 A  8/1974 Minney
5,757,242 A * 5/1998 Chow .................. H03K 3/0307
                                                   327/333
(Continued)

FOREIGN PATENT DOCUMENTS

EP    0 488 394 A2   6/1992
EP    0 563 945 A1   10/1993
EP    1 333 501 A2   8/2003

OTHER PUBLICATIONS

S. Farahvash, C. Quek, M. Mak, "A temperature Compensated Digitally-Controlled Crystal Pierce Oscillator for Wireless Applications," Feb. 3-7, 2008, pp. 352-353 & 619, IEEE, San Jose, USA.

(Continued)

*Primary Examiner* — Arnold M Kinkead
(74) *Attorney, Agent, or Firm* — Wolf, Greenfield & Sacks, P.C.

(57) ABSTRACT

An oscillator apparatus includes an oscillator core circuit. The oscillator core circuit includes an inverting transconductance amplifier, at least one first capacitor, at least one second capacitor, and a resonator. The at least one first capacitor is connected between an input of the inverting transconductance amplifier and a ground level. The at least one second capacitor is connected between an output of the inverting transconductance amplifier and the ground level. The resonator has a first port connected to the input of the inverting transconductance amplifier and a second port connected to the output of the inverting transconductance amplifier. The first port is decoupled from the second port.

10 Claims, 7 Drawing Sheets

(51) Int. Cl.
*H03B 5/36* (2006.01)
*H03L 5/00* (2006.01)

(52) U.S. Cl.
CPC .......... *H03L 5/00* (2013.01); *H03B 2200/009* (2013.01); *H03B 2200/0062* (2013.01)

(58) Field of Classification Search
USPC .......................................... 331/158, 116 FE
See application file for complete search history.

(56) References Cited

U.S. PATENT DOCUMENTS

| | | |
|---|---|---|
| 6,798,301 B1 | 9/2004 | Balan |
| 7,123,113 B1 * | 10/2006 | Brennan .................. H03L 5/00 331/158 |
| 7,598,821 B2 | 10/2009 | Novac |
| 8,773,215 B2 | 7/2014 | Sadhu et al. |
| 2005/0184812 A1 | 8/2005 | Cho |
| 2007/0046387 A1 | 3/2007 | Blum |
| 2007/0103248 A1 | 5/2007 | Nakamura |
| 2010/0321123 A1 | 12/2010 | Casagrande |
| 2015/0116048 A1 | 4/2015 | Yamamoto |
| 2015/0145611 A1 | 5/2015 | Ito |
| 2016/0373056 A1 * | 12/2016 | Kumar .................... H03B 5/06 |
| 2017/0077931 A1 * | 3/2017 | Viegas ..................... H03L 3/00 |

OTHER PUBLICATIONS

J. Lin, A low-phase-noise 0.004-ppm/step DCXO with guaranteed monotonicity in the 90-nm CMOS process, Dec. 5, 2005, 2726-2734 pages, IEEE, USA.

* cited by examiner

OSCILLATOR SCHEME CAPABLE OF REDUCING FAR-OUT PHASE NOISE AND CLOSED-IN PHASE NOISE

CROSS REFERENCE TO RELATED APPLICATIONS

This application claims priority of U.S. provisional application Ser. No. 62/267,296 filed on Dec. 15, 2015, which is entirely incorporated herein by reference.

BACKGROUND

The present invention relates to an oscillator scheme, and more particularly to an oscillator apparatus capable of reducing far-out phase noise as well as closed-in phase noise.

In order to reduce closed-in phase noise (e.g. frequency offsets below 100 Hz), a conventional two-pin oscillator such as a conventional Pierces oscillator is arranged to generate and output a smaller voltage signal to a next stage circuit. The smaller amplitude may avoid active devices such as transistors to be affected by nonlinearity effects. However, the smaller amplitude (voltage swing) also means that the device driving capability of the conventional Pierces oscillator is limited. The conventional Pierces oscillator is unable to reduce far-out phase noise (e.g. frequency offsets above 10 KHz). On the other hand, in order to reduce the far-out phase noise (e.g. frequency offsets above 10 KHz), another type of conventional Pierces oscillator is arranged to generate and output a larger voltage signal to a next stage circuit. The larger amplitude improves the device driving capability, but the larger amplitude (voltage swing) unfortunately causes active devices to be affected by the nonlinearity effects. This type of conventional Pierces oscillator is incapable of reducing closed-in phase noise. Thus, both the Pierces oscillators now developed by current industry are unable to reduce far-out phase noise as well as closed-in phase noise simultaneously.

SUMMARY

Therefore one of the objectives of the present invention is to provide an oscillator apparatus capable of reducing far-out phase noise and closed-in phase noise, to solve the above-mentioned problems.

According to embodiments of the present invention, an oscillator apparatus includes an oscillator core circuit. The oscillator core circuit includes an inverting transconductance amplifier, at least one first capacitor, at least one second capacitor, and a resonator. The at least one first capacitor is connected between an input of the inverting transconductance amplifier and a ground level. The at least one second capacitor is connected between an output of the inverting transconductance amplifier and the ground level. The resonator has the first port connected to the input of the inverting transconductance amplifier and the second port connected to the output of the inverting transconductance amplifier. The first port is decoupled from the second port. So the common mode of two ports can be defined independently.

According to the embodiments, the capacitance of the at least one first capacitor is further configured to be smaller than that of the at least one second capacitor.

According to the embodiments, the amplitude of a voltage signal at the first port of the resonator is further larger than that of a voltage signal at the second port of the resonator.

According to the embodiments, the oscillator apparatus further comprises a DC coupling circuit and a driver. The DC coupling circuit is placed between the oscillator core circuit and the driver, so there is no AC coupling capacitors and its loss.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
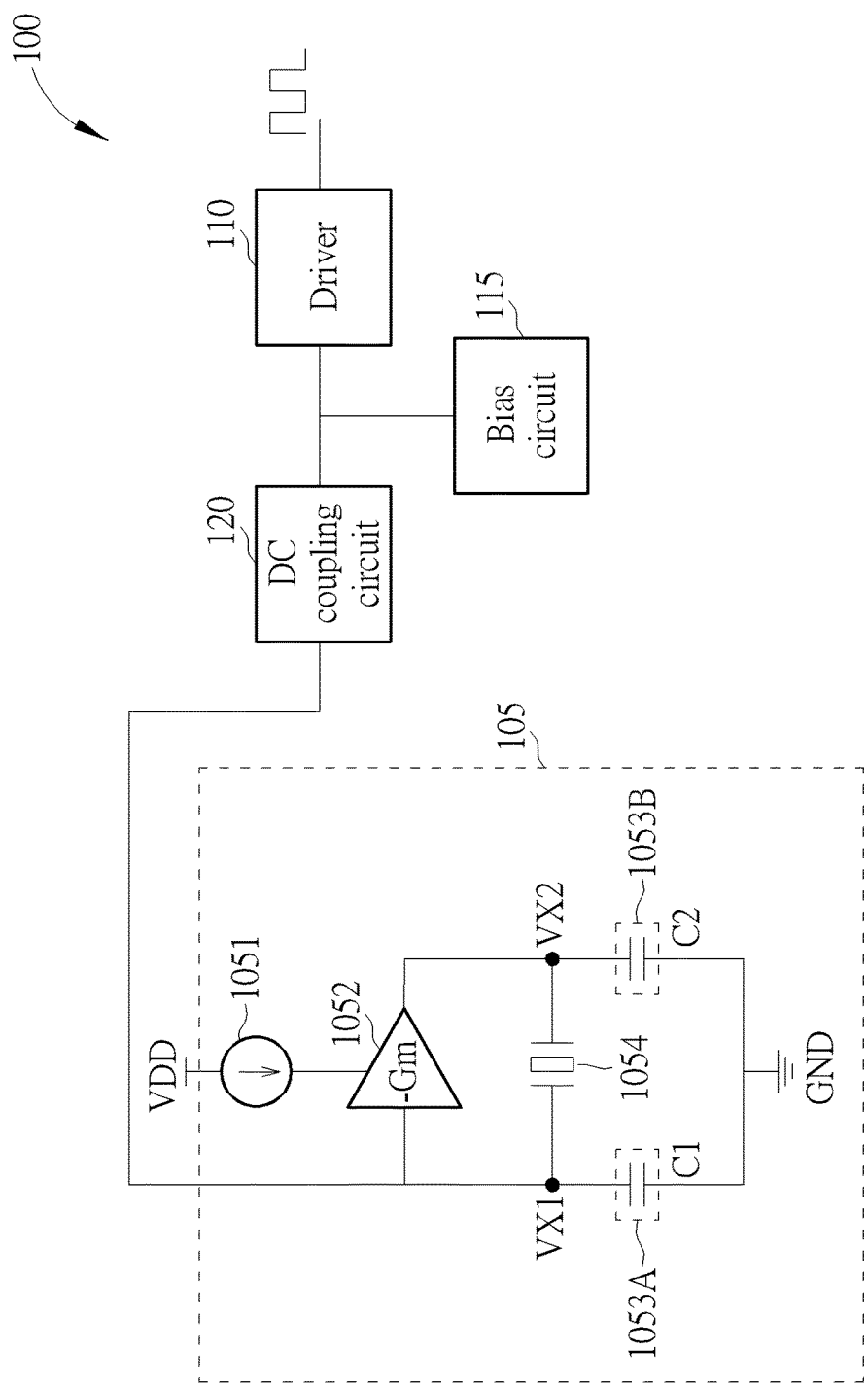
FIG. 1 is a diagram of an oscillator apparatus according to a first embodiment of the invention.

Please refer to FIG. 1, which is a diagram of an oscillator apparatus 100 according to a first embodiment of the invention. In the embodiment, the oscillator apparatus 100 is a two-pin oscillator apparatus (not limited) and/or an on-chip oscillator apparatus (not limited). The oscillator apparatus 100 is capable of reducing far-out phase noise as well as reducing closed-in phase noise. The definition of far-out phase noise, for example, refers to the phase/offset noise far from a specified frequency such as frequency offset(s) higher than 10 KHz, and the definition of closed-in phase noise for example refers to the frequency offset component that is within the neighborhood of the specified frequency, e.g. frequency offset(s) lower than 100 Hz. It should be noted that the above-mentioned examples of offset frequencies are used for illustrative purposes and are not intended to be limitations of the invention. The oscillator apparatus 100 is able to achieve both far-out and closed-in phase noise improvements. In this embodiment, the phase noise improvements are achieved by enhancing devices' driving capability, providing sufficient signal amplitude for a driver, and avoiding active devices entering non-linear operating region (triode region); these are described later.

In practice, the oscillator apparatus 100 comprises an oscillator core circuit 105, a driver 110, a bias circuit 115, and a DC coupling circuit 120 placed between oscillator core circuit 105 and driver 110. The driver 110 can be implemented by a squarer, an inverter buffer, or a voltage gain buffer, and so on. The oscillator core circuit 105 comprises a current source 1051, an inverting transconductance amplifier 1052 with a negative transconductance gain −Gm, at least one first capacitor 1053A, at least one second capacitor 1053B, and a resonator 1054. The inverting transconductance amplifier 1052 with negative transconductance gain −Gm can be implemented by any kinds of active devices such as MOS transistors and/or bipolar transistors. In this embodiment, the oscillator core circuit 105 includes one first capacitor 1053A with capacitance C1 and one second capacitor 1053B with capacitance C2. In other embodiments, the oscillator core circuit 105 can be configured to include a first capacitor array 1053A having multiple first capacitors with different capacitances and a second capacitor array 1053B having multiple second capacitors with different capacitances. The number of first capacitor(s) 1053A and/or number of second capacitor(s) 1053B is not meant to be a limitation of the invention. In this embodiment, the first capacitor 1053A is connected between the input of the inverting transconductance amplifier 1052 and a ground level GND, and the second capacitor 1053B is connected between the output of the inverting transconductance amplifier 1052 and the ground level GND. The resonator 1054 includes a first end/node/port connected to the input of the inverting transconductance amplifier 1052 and a second end/node/port connected to the output of the inverting transconductance amplifier 1052. The first port of resonator 1054 is decoupled from its second port wherein the first port corresponds to the voltage signal VX1 and the second port corresponds to the voltage signal VX2; as shown in FIG. 1, no feedback circuits are placed between the first port and second port of resonator 1054. The DC voltage bias level at the first port is not dependent upon and not controlled based on the DC voltage bias level at the second port. The voltage signal VX1 generated at the first port of oscillator core circuit 105 is transmitted to the driver 110 via the DC coupling circuit 120 and is biased by the bias circuit 115. The voltage signals VX1 and VX2 generate a signal VO on the resonator 1054. In practice, the signal VO of the resonator 1054 can be determined based on the following equations:

$$VO = VX1 - VX2$$
$$VX1 = \frac{C2}{C1+C2} \times VO$$
$$VX2 = -\frac{C1}{C1+C2} \times VO$$

(this adds polarity on VX2)

wherein C1 is the capacitance of first capacitor 1053A, and C2 is the capacitance of second capacitor 1053B.

Via the DC coupling circuit 120, the first port of resonator 1054 can be DC coupled to the driver 110, and no AC coupling circuits are needed. In practice, the DC coupling circuit 120 can be implemented by using a wire and/or a resistor to pass the full spectrum of signal including direct current to the driver 110. No AC coupling capacitors are used as high-pass filters, and the bias circuit 115 can be implemented by using a low noise bias circuit to provide a bias voltage with low noise as the common mode voltage for the oscillator core circuit 105 and driver 110. As shown in FIG. 1, the bias circuit 115 is connected to the first port of resonator 1054 and configured to provide the common mode voltage to the first port of resonator 1054. Even though the noise of bias circuit 115 is transmitted to the oscillator core circuit 105, the far-out phase noise can still be suppressed by resonator 1054.

The input of the driver 110 is DC coupled to the input of the inverting transconductance amplifier 1052 and the first port of the resonator 1054. The driver 110 generates and outputs a square-wave signal at its output node based on the waveform of the voltage signals VX1 generated from the first port of resonator 1054. The oscillator apparatus 100 provides the square-wave signal for a next stage circuit as a reference clock signal.

For far-out phase noise improvement, instead of using AC coupling blocks, the DC coupling circuit 120 is employed and connected between the driver 110 and the first port of resonator 1054 since the first port is decoupled from the second port (i.e. no feedback paths between voltage signals VX1 and VX2). Capacitor(s) used for AC coupling can be eliminated, and the voltage signal VX1 transmitted to the driver 110 is not attenuated by the AC coupling capacitor(s).

For far-out and closed-in phase noise improvements, in this embodiment, the capacitance C1 of first capacitor 1053A is configured to be smaller than the capacitance C2 of second capacitor 1053B. The capacitors 1053A and 1053B can be implemented on a chip. In addition, the capacitances C1 and C2 can be digitally controlled. The amplitudes of voltage signals VX1 and VX2 are redistributed or adjusted based on the following equation:

$$\frac{AX1}{AX2} = \frac{C2}{C1}$$

AX1 and AX2 respectively indicate the amplitudes (i.e. the swings) of voltage signals VX1 and VX2 at two ports of resonator 1054. The amplitude AX1 of voltage signal VX1 is inversely proportional to the capacitance C1, and the amplitude AX2 of voltage signal VX2 is inversely proportional to the capacitance C2. The ratio of amplitude AX1 to amplitude AX2 is enlarged since of the larger capacitance C2 and smaller capacitance C1. This configuration can effectively avoid the current source 1051 entering the triode region as well as avoiding the inverting transconductance amplifier 1052 entering the triode region, which induces non-linear effects.

Figure 2A:
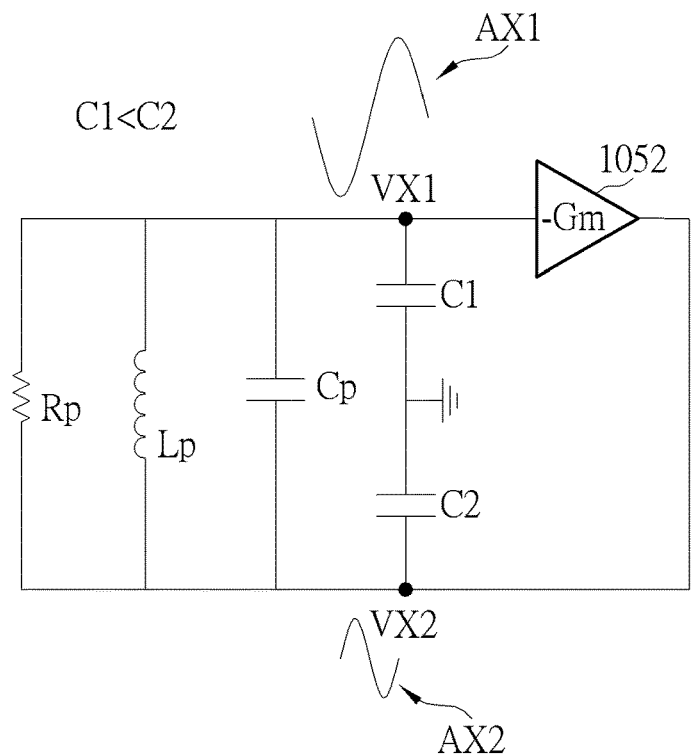
FIG. 2A is an equivalent circuit diagram of the oscillator core circuit as shown in FIG. 1.
Figure 2B:
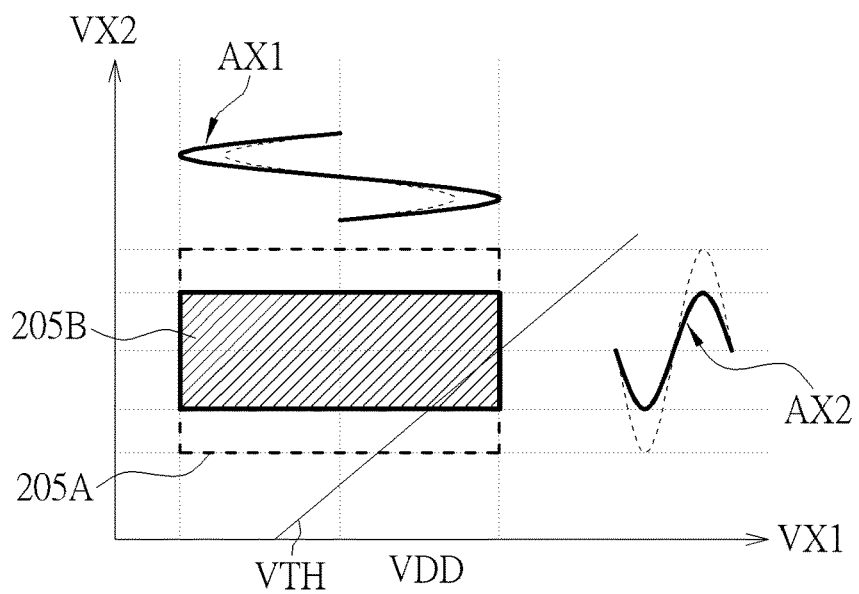
FIG. 2B is a diagram illustrating the operating regions of the current source and inverting transconductance amplifier of FIG. 1.

To describe the advantage of the design of different capacitances C1 and C2, please refer to FIG. 2A in conjunction with FIG. 2B. FIG. 2A is an equivalent circuit diagram of the oscillator core circuit 105 as shown in FIG. 1. FIG. 2B is a diagram illustrating the operating regions of the current source 1051 and inverting transconductance amplifier 1052 of FIG. 1. As shown in FIG. 2A, the resonator 1054 comprises the resistor Rp, inductor Lp, and capacitor Cp. The amplitude AX1 of voltage signal VX1 is enlarged and larger than the amplitude AX2 of voltage signal VX2 because the capacitance C2 is configured to be larger than capacitance C1. As shown in FIG. 2B, the two swings represented by dotted curves indicate the voltage swings at two ports of a conventional oscillator, and two swings represented by solid curves indicate the voltage amplitudes (AX1 and AX2) at two ports of the resonator 1054. A block 205A surrounded by dotted lines includes operating regions of triode region and saturation region, and this represents that there is a great possibility that active devices of the conventional oscillator may enter the triode region frequently and performances of the active devices are degraded due to closed-in phase noise. However, compared to the conventional oscillator, to reduce the closed-in phase noise, the amplitude AX1 is enlarged, and the amplitude AX2 is reduced. Based on the designed/configured amplitudes AX1 and AX2, active devices of current source 1051 and inverting transconductance amplifier 1052 can be maintained or kept in the saturation region which is represented a block 205B surrounded by solid lines and including slanting lines as shown in FIG. 2B. That is, the operating regions of the active devices can be kept within the saturation region almost for whole operating cycles of the active devices. This significantly reduces the possibility that the active devices enter the triode region and degrades closed-in phase noise as far as possible.

Figure 3:
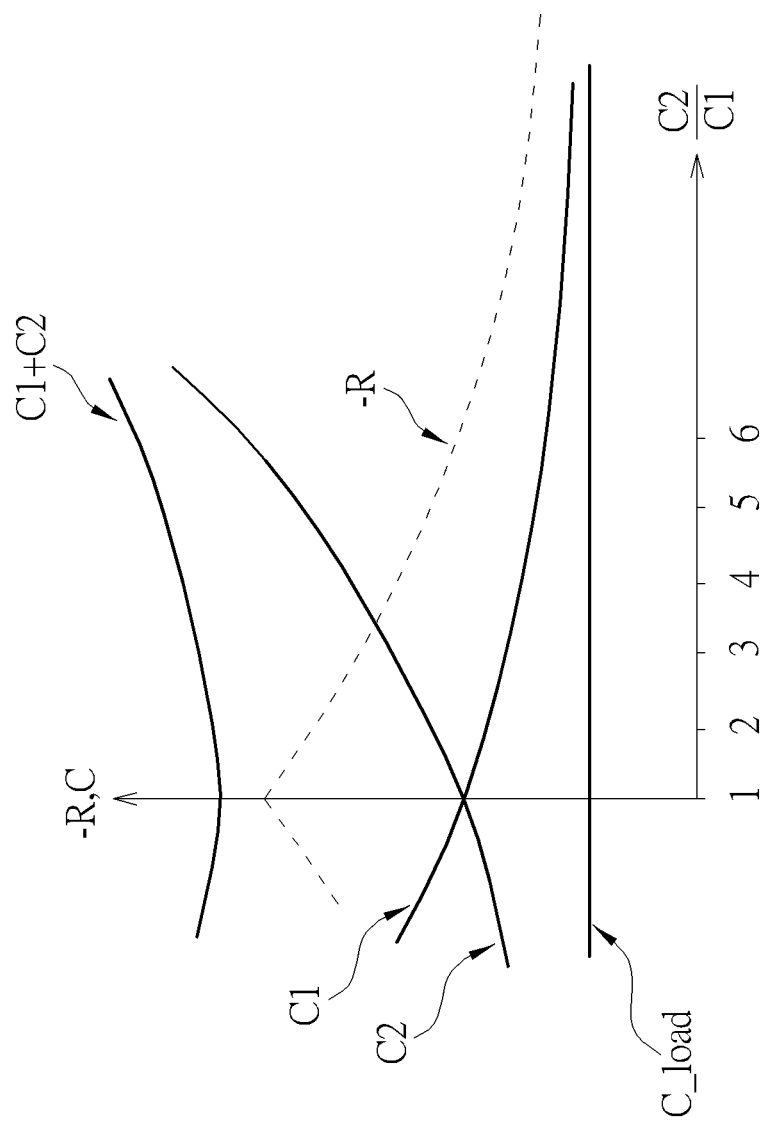
FIG. 3 is a diagram illustrating a relation between different negative resistance of resonator and different ratio of C2 over C1 according to the embodiment of FIG. 1.

FIG. 3 is a diagram illustrating a relation between different negative resistance conditions of resonator 1054 and different choices of the ratio of C2 to C1 according to the embodiment of FIG. 1. The negative resistance –R is determined and can be adjustable based on the following equation:

$$-R = \frac{-Gm}{\omega^2 \times C1 \times C2}$$

The dotted curve of FIG. 3 indicates the value of negative resistance –R, and the value of negative resistance –R is at the maximum value when the capacitance C1 is equal to C2. The maximum value of negative resistance –R indicates an optimal start-up condition for a conventional oscillator, and the conventional oscillator is arranged to operate under the optimal start-up condition (i.e. adopting the maximum value of negative resistance –R) as far as possible. Thus, it is prone for a conventional two-port oscillator to configure two capacitors within the conventional two-port oscillator as the same capacitance considering the optimal start-up condition.

However, in the embodiment of the invention, considering the phase noise improvements, the capacitance C2 of second capacitor 1053B is configured to be larger than the capacitance C1 of first capacitor 1053A, and the ratio of C2 to C1 is configured to be higher than one, for example 1.1 or 1.2. Load capacitance C_load is determined as:

$$C\_load = \frac{C1 \times C2}{C1 + C2}$$

To keep the load capacitance C_load be constant or fixed (but not limited), the sum of C1 and C2 can be designed/configured to become larger when the ratio of C2 to C1 becomes higher, as shown in FIG. 3. To avoid any active devices such as transistors within the oscillator apparatus 100 entering the triode region, the ratio of C2 to C1 is designed or configured to be higher than 1.1 considering that actual capacitance variations in percentage may vary from –10% to +10%. In a preferred example, the ratio of C2 to C1 is configured to be higher than value of 1.2. That is, the lower bound of ratio C2 to C1 is configured as 1.1 or 1.2. Additionally, the upper bound of ratio C2 to C1 can be determined based on the design requirements of the negative resistance/capacitance (–R) and the total capacitor area. These modifications all fall within the scope of the invention.

In addition, for implementations of capacitors 1053A and 1053B, to achieve larger amplitude AX1 and reduce closed-in phase noise, the first capacitor 1053A can be implemented with a voltage independent linear capacitor, which is unchanged with the variation of a voltage swing actually. In addition, to achieve saving die area of larger capacitance, the second capacitor 1053B can be implemented with a high density capacitor, which has the capacitance is moderately changed by voltage swing. For example, if the capacitance of a high density capacitor is as four times as that of a linear capacitor. Assuming the same C_load, the required total capacitor area is as 2.4 times as the required area of a linear capacitor when the ratio of C2 to C1 is equal to one and the first capacitor 1053A and the second capacitor 1053B both are implemented by linear capacitors. Alternatively, the required total capacitor area is as 2.5 times as the required circuit area of the linear capacitor when the ratio of C2 to C1 is equal to 1.5 and the first capacitor 1053A and second capacitor 1053B both are implemented by linear capacitors. The capacitor area may be a little larger than original one as expected. However, the required total capacitor area can be decreased as 1.375 times as the required circuit area of the linear capacitor if the first capacitor 1053A and the second capacitor 1053B are implemented by a linear capacitor and a high density capacitor respectively. That is, this invention can save chip area of capacitor as well as achieving degradation of the signal-to-noise ratio (SNR).

In addition, the linear capacitor can be implemented by a metal insulator metal (MIM) capacitor or a metal oxide metal (MOM) capacitor (but not limited). The high density capacitor can be implemented by a metal oxide semiconductor (MOS) capacitor (but not limited). All these can take advantage that the oscillator apparatus 100 can be operated at a low voltage level and/or the active devices of oscillator apparatus 100 can be manufactured by using a low cost process.

Figure 4:
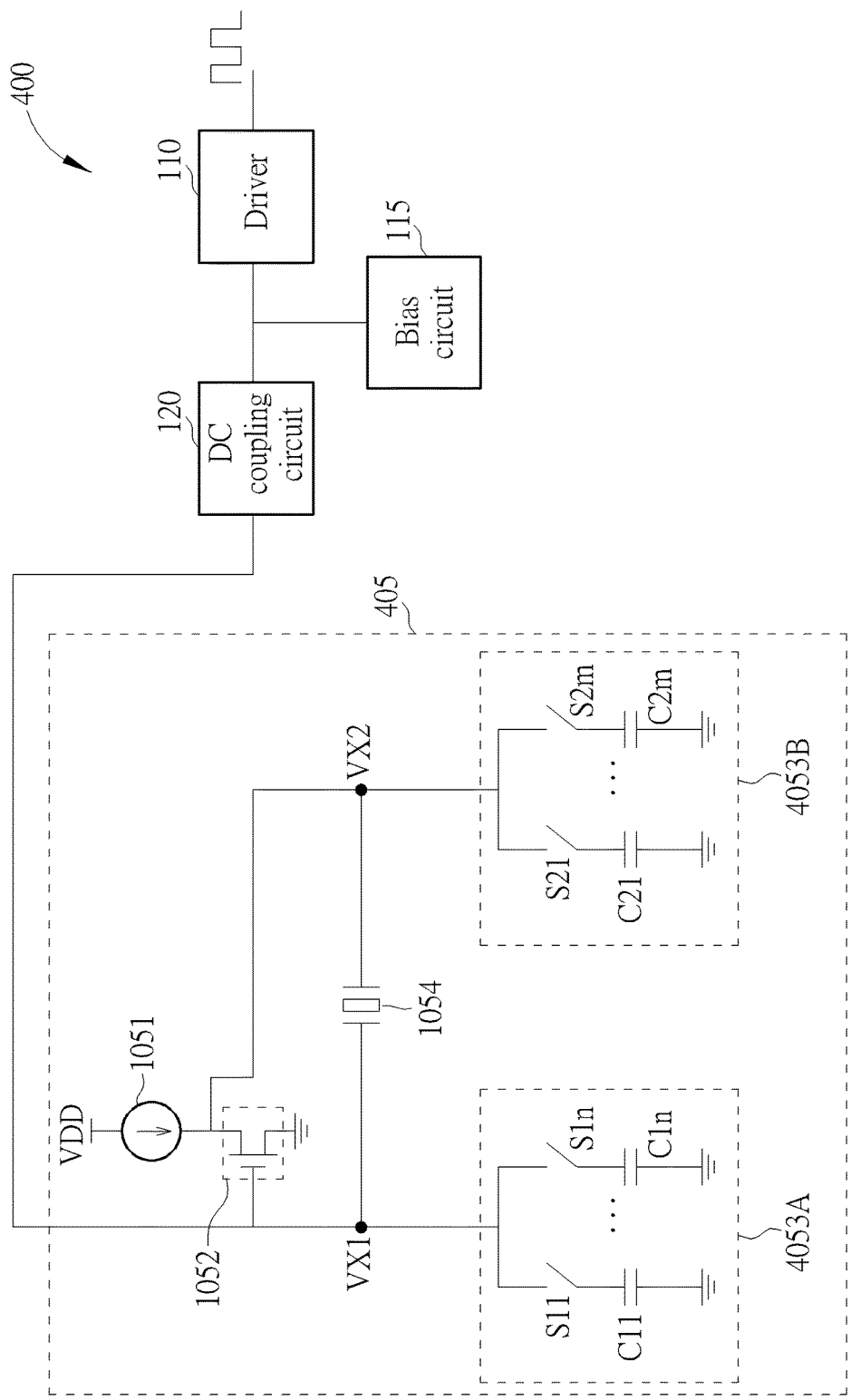
FIG. 4 is a diagram of an oscillator apparatus according to the second embodiment of the invention.

Furthermore, the first capacitor and/or the second capacitor can be tunable capacitor array(s) to overcome the uncertainty of off-chip parasitic capacitance. FIG. 4 is a diagram of an oscillator apparatus 400 according to a second embodiment of the invention. The oscillator apparatus 400 can be a two-pin oscillator apparatus (not limited) and/or an on-chip oscillator apparatus (not limited). The oscillator apparatus 400 is capable of reducing far-out phase noise as well as reducing closed-in phase noise. In practice, the oscillator apparatus 400 comprises an oscillator core circuit 405, the driver 110, the bias circuit 115, and the Dc coupling circuit 120 placed between oscillator core circuit 105 and driver 110. The oscillator core circuit 405 comprises the current source 1051, the inverting transconductance amplifier 1052 with negative transconductance gain –Gm, the first switched capacitor array 4053A, the second switched capacitor array 4053B, and the resonator 1054. The first switched capacitor array 4053A comprises a plurality of switches S11-S1$n$ and a plurality of first capacitors with different/equal capacitances C11-C1$n$. The second switched capacitor array 4053B comprises a plurality of switches S21-S2$m$ and a plurality of second capacitors with different/equal capacitances C21-C2$m$. Parameters n and m are positive integers and can be equal to each other or be different. Based on the switches S11-S1$n$ and S21-S2$m$ as well as capacitances C11-C1$n$ and C21-C2$m$, the oscillator apparatus 400 can be used for providing an output signal with different oscillation frequencies. In addition, as shown in FIG. 4, the inverting transconductance amplifier 1052 can be implemented by using an NMOS transistor having a control node connected to the first port of resonator 1054, a first node connected to the current source 1052 and second port of resonator 1054, and a second node connected to the ground level.

Figure 5:
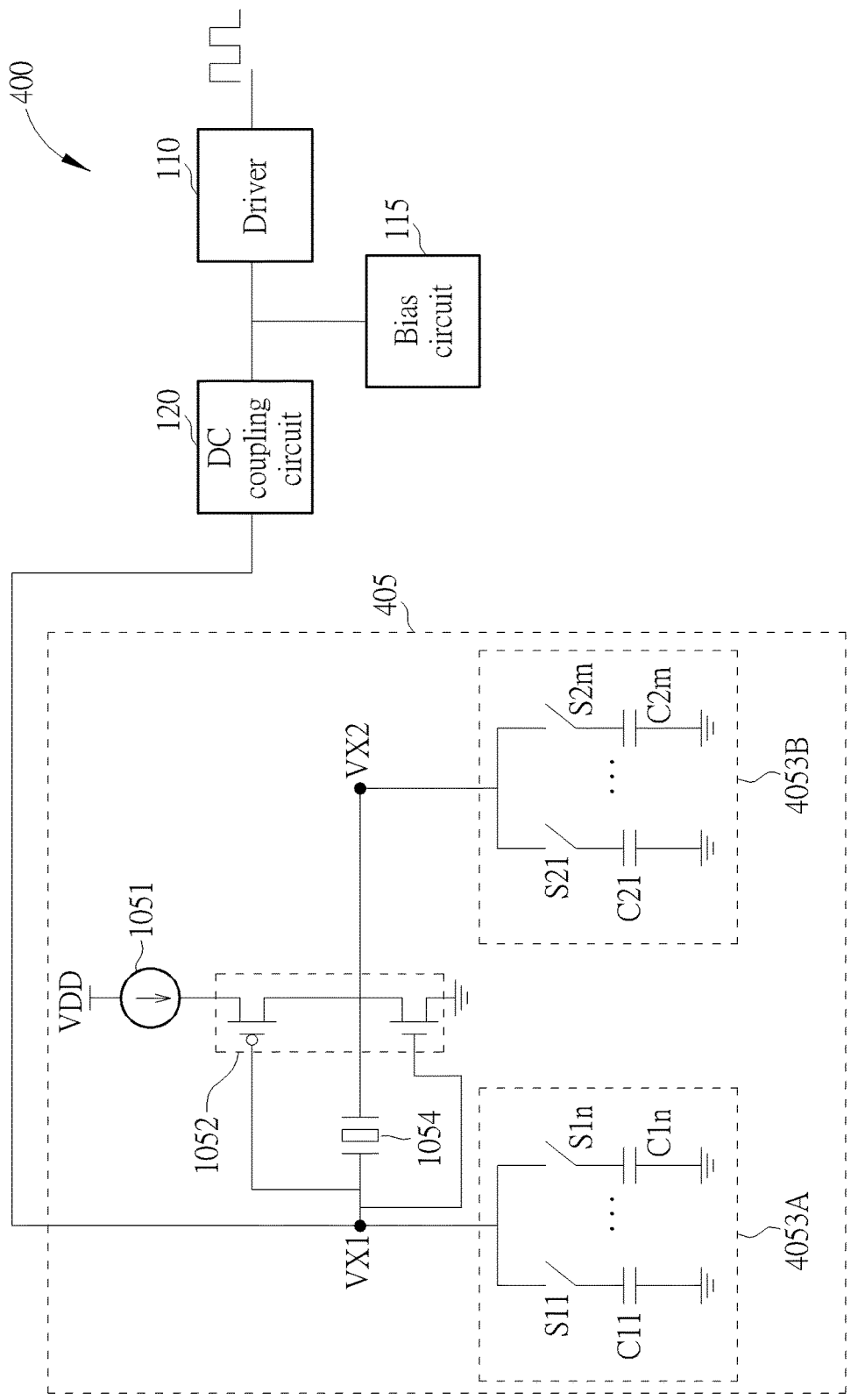
FIG. 5 is a diagram illustrating another implementation of the oscillator apparatus as shown in FIG. 4.

In addition, the inverting transconductance amplifier can be implemented by using COMS structure. FIG. 5 is a diagram illustrating another implementation of the oscillator apparatus 400 as shown in FIG. 4. The inverting transconductance amplifier 1052 within apparatus 400 is implemented by using complementary MOS structure circuit. The inverting transconductance amplifier 1052 of FIG. 5 comprises a NMOS transistor and a PMOS transistor. The PMOS transistor includes a control node connected to the first port of resonator 1054, a first node connected to the current source 1051, and a second node connected to the second port of resonator 1054. The NMOS transistor includes a control node connected to the first port of resonator 1054, a first node connected to the second port of resonator 1054 and second node of the PMOS transistor, and a second node connected to the ground level.

Figure 6:
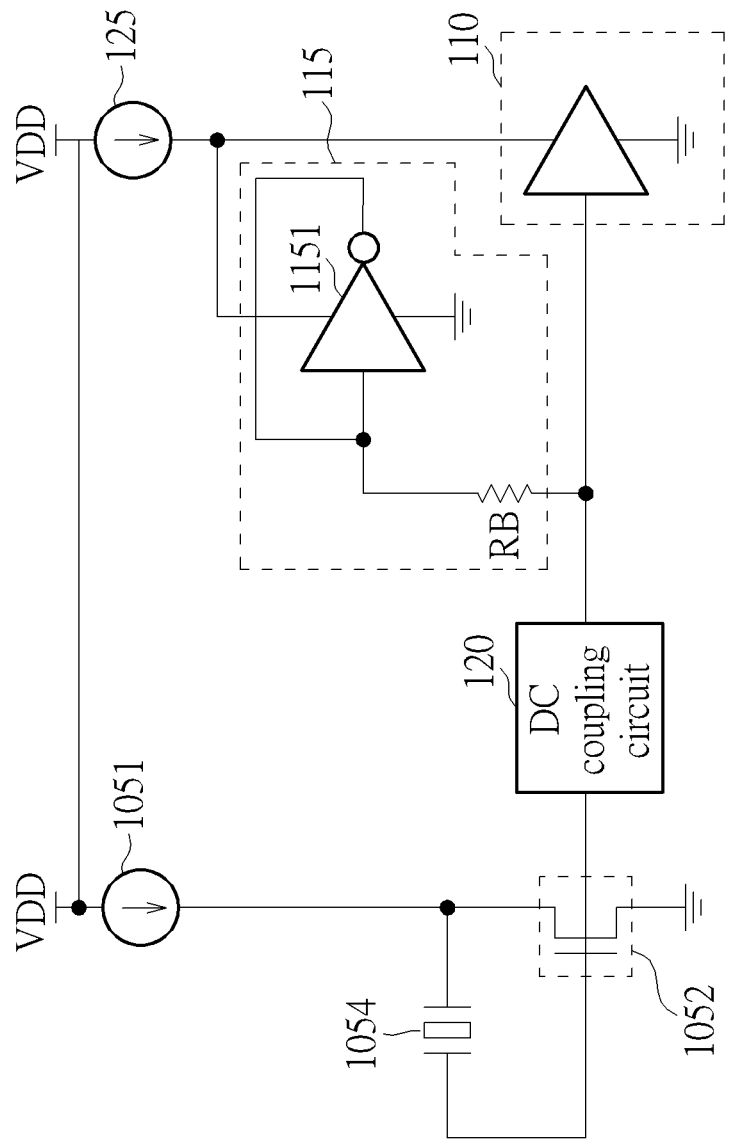
FIG. 6 is a diagram illustrating an embodiment of the bias circuit as shown in FIG. 1.
Figure 7:
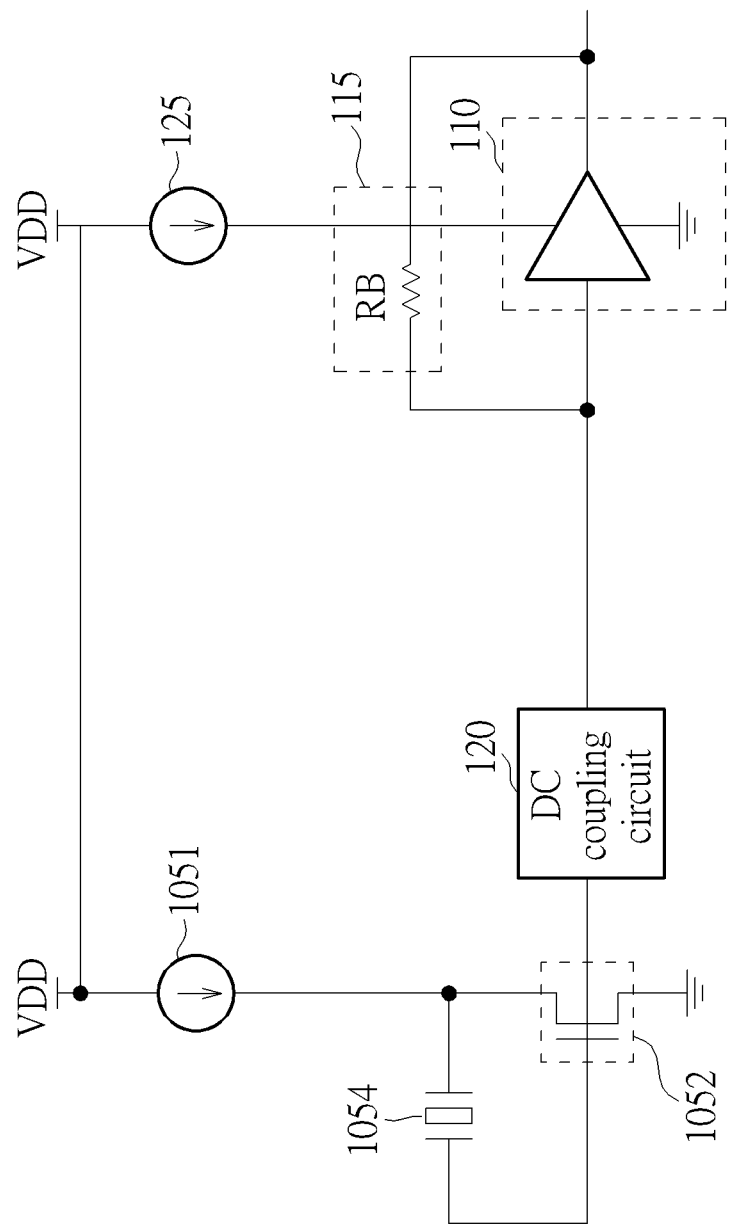
FIG. 7 is a diagram illustrating another embodiment of the bias circuit as shown in FIG. 1.

Further, the bias circuit 115 can be implemented by various kinds of circuits. FIG. 6 and FIG. 7 respectively illustrate different embodiments of the bias circuit 115 as shown in FIG. 1. As shown in FIG. 6, the bias circuit 115 comprises a resistor RB and an inverter 1151. The inverter size is selected according to consideration of low-noise and optimal bias point. The resistor RB is coupled between the Dc coupling circuit 120 and the inverter 1151, and the resistor RB used as a high impedance/resistance to avoid noise loaded to the resonator 1054. The inverter 1151 includes an input node coupled to the resistor RB and connected to its output node. The inverter 1151 can be biased and controlled by a specific current provided from a current source 125 that is also used for providing the specific voltage to bias and control the driver 110. Alternatively, as shown in FIG. 7, the bias circuit 115 comprises the resistor RB that is connected between the input node of driver 110 and the output node of driver 110. These modifications all fall within the scope of the invention.

Furthermore, for the operation of the oscillator apparatus 100/400, the upper bound limit of the ratio of C2 to C1 can be determined/calculated based on a frequency tuning range, load capacitance C_load, and the negative resistance –R specified above. In addition, the lower bound limit of the ratio of C2 to C1 is determined/calculated to avoid the active devices entering the triode region.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An oscillator apparatus, comprising:
   an oscillator core circuit, comprising:
      an inverting transconductance amplifier;
      at least one first capacitor, connected between an input of the inverting transconductance amplifier and a ground level;
      at least one second capacitor, connected between an output of the inverting transconductance amplifier and the ground level; and
      a resonator, having a first port connected to the input of the inverting transconductance amplifier and a second port connected to the output of the inverting transconductance amplifier, the first port of the resonator being decoupled from the second port of the resonator;
   a DC coupling circuit, having one end connected to the input of the inverting transconductance amplifier and the first port and having another end connected to a driver; and
   the driver, having an input DC coupled to the first port via the DC coupling circuit.

2. The oscillator apparatus of claim 1, wherein a DC voltage bias level at the first port is controlled not based on a DC voltage bias level at the second port.

3. An oscillator apparatus, comprising:
   an oscillator core circuit, comprising:
      an inverting transconductance amplifier;
      at least one first capacitor, connected between an input of the inverting transconductance amplifier and a ground level;
      at least one second capacitor, connected between an output of the inverting transconductance amplifier and the ground level; and
      a resonator, having a first port connected to the input of the inverting transconductance amplifier and a second port connected to the output of the inverting transconductance amplifier, the first port of the resonator being decoupled from the second port of the resonator; and
   a bias circuit, connected to the first port, configured to provide a common mode voltage level for a voltage signal at the first port.

4. The oscillator apparatus of claim 1, wherein the driver comprises at least one of a squarer, an inverter buffer, and a voltage gain buffer.

5. The oscillator apparatus of claim 3, wherein the bias circuit comprises:
   an inverter, biased and controlled by a specific current of a current source, an output of the inverter being connected to an input of the inverter; and
   a resistor, connected between the first port of the resonator and the input of the inverter,
   wherein the driver is further biased by the specific current of the current source.

6. The oscillator apparatus of claim 1, wherein the bias circuit comprises:
   a resistor, having one end connected to an input of the driver and another end connected to an output of the driver.

7. The oscillator apparatus of claim 1, wherein:
   the at least one first capacitor comprises a plurality of first capacitors connected in parallel and selectively coupled to the first port of the resonator via a plurality of first switches respectively; and
   the at least one second capacitor comprises a plurality of second capacitors connected in parallel and selectively coupled to the second port of the resonator via a plurality of second switches respectively.

8. The oscillator apparatus of claim 1, wherein a capacitance of the at least one first capacitor is smaller than a capacitance of the at least one second capacitor.

9. An oscillator apparatus, comprising:
   an oscillator core circuit, comprising:
      an inverting transconductance amplifier;
      at least one first capacitor, connected between an input of the inverting transconductance amplifier and a ground level;
      at least one second capacitor, connected between an output of the inverting transconductance amplifier and the ground level; and
      a resonator, having a first port connected to the input of the inverting transconductance amplifier and a second port connected to the output of the inverting transconductance amplifier, the first port of the resonator being decoupled from the second port of the resonator,
   wherein a capacitance of the at least one first capacitor is smaller than a capacitance of the at least one second capacitor, and
   wherein an amplitude of a voltage signal at the first port of the resonator is larger than an amplitude of a voltage signal at the second port of the resonator.

10. The oscillator apparatus of claim 8, wherein the at least one first capacitor is a linear capacitor, and the at least one second capacitor is a high density capacitor.

* * * * *